Feb. 26, 1963 W. S. ELLIOTT ET AL 3,079,571
FILTER UTILIZING VARIABLE CAPACITANCE JUNCTION DIODES
Filed Feb. 6, 1957
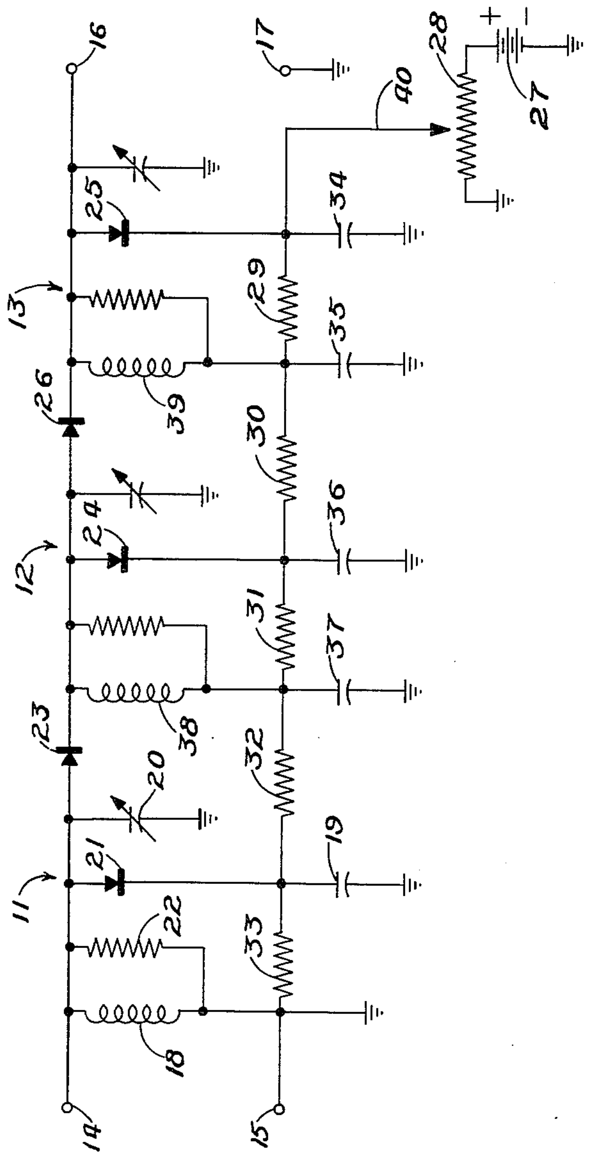
INVENTORS
WILLIAM S. ELLIOTT
DOMENICK P. VITERISI
BY
[signature]
ATTORNEY 3,079,571

FILTER UTILIZING VARIABLE CAPACITANCE JUNCTION DIODES

William S. Elliott and Domenick P. Viterisi, Cedar Rapids, Iowa, assignors to Collins Radio Company, Cedar Rapids, Iowa, a corporation of Iowa Filed Feb. 6, 1957, Ser. No. 638,555
1 Claim. (Cl. 333—76)

This invention pertains to electrical filters and particularly to electrical bandpass filters that utilize variable-capacitance junction diodes for tuning and for coupling.

An object of the present invention is to provide a compact tunable filter.

Another object is to provide a filter that is easily tuned by local or remote means that require a minimum amount of power.

A feature of the filter of this invention is the utilization of tuning diodes at one voltage for providing required tuning capacitance and of coupling diodes at another voltage for providing required coupling capacitance. The description and appended claim of the instant invenvention may be more readily understood with reference to the accompanying single drawing which is a schematic diagram of a typical three-section filter.

The variable-capacitance junction diodes utilized in the filters of this invention are designed to have desirable variable-capacitance characteristics. Junction diodes to which voltage is applied in a reverse sense (non-conducting), exhibit capacitance values dependent upon the magnitude of the applied voltage. For example, the capacitance of a typical germanium junction diode that is designed for desirable variable-capacitance characteristics changes from 80 micromicrofarad, when one-volt bias is applied, to 30 micromicrofarad, when 10-volt bias is applied. The inductance of a diode that has short, thick connecting leads is low enough to operate satisfactorily in resonant circuits that are tunable in the ultra-high frequency range. The series resistance of the diode is low so that associated circuits may have high Q.

The circuit shown in the accompanying drawing has three similar filter sections 11, 12, and 13 connected in series between input terminals 14—15 and output terminals 16—17. Filter section 11 includes inductor 18 connected in parallel with variable-capacitive elements consisting of variable trimmer capacitor 20 and variable-capacitance junction diode 21. The variable-capacitance junction diode 21 is connected in parallel with inductor 18 through bypass capacitor 19. Resistor 22 is connected in parallel with the resonant circuit and has a selected value for determining the Q of the resonant circuit. Filter section 12 is connected to filter section 11 through variable-capacitance junction diode 23 and, likewise, filter section 13 is connected to filter section 12 through junction diode 26. Filter sections 12 and 13 are similar to section 11 and include variable-capacitance junction diodes 24 and 25, respectively, for tuning. The tuning control circuit for varying the biasing voltage that is applied to the junction diodes comprises a source of variable direct-current voltage and a voltage divider. For example, the source of variable voltage may consist of battery 27 connected in parallel with potentiometer 28. The arm of the potentiometer is connected to the voltage divider so that the voltage for tuning the filter may be varied by adjustment of the arm of the potentiometer. The polarity of the voltage applied to the diodes is a reverse voltage such that the diodes are in a non-conducting state. This variable voltage may be derived from an automatic-frequency-control circuit or from other control circuits that may be either locally or remotely located with respect to the filter. The voltage divider for applying required voltages to the junction diodes consist of series resistors 29—33 connected between the arm of potentiometer 28 and the negative terminal of direct-current voltage source 27. Bypass capacitors 19 and 34—37 are connected individually to the junctions of the resistors for completing signal circuits through a common return lead or ground.

Resistors 29, 31, and 33 which have alternate positions in the voltage divider are connected to individual resonant circuits for applying control bias voltage to tuning variable-capacitance junction diodes 25, 24, and 21, respectively. In detail, the direct-current circuit for applying bias voltage to tuning junction diode 21 includes resistor 33 and inductor 18. Since the resistance of inductor 18 is comparatively low and the reverse resistance of diode 21 is very high, substantially all of the voltage that is developed across resistor 33 is applied to the diode. When it is desired to have the different sections of the filter tuned to the same frequency, the resistances of resistors 29, 31, and 33 are the same and the associated variable-capacitance junction diodes are selected to have similar capacitance versus voltage characteristics.

Different adjoining pairs of resistors in the voltage divider are connected for applying control voltage to coupling variable-capacitance junction diodes 23 and 26. For example, the direct-current circuit for biasing junction diode 23 includes inductor 38, resistors 32 and 33, and inductor 18. Likewise, the circuit for biasing coupling junction diode 26 includes inductor 39, resistors 30 and 31, and inductor 38. Obviously, the voltage applied to the coupling variable-capacitance junction diodes is greater than that applied to the tuning variable-capacitance junction diodes. For example, the voltage applied to a coupling junction diode 23 is equal to the voltage developed across resistor 33, which is applied to variable-capacitance coupling diode 21, plus that voltage which is developed across resistor 32. Through this arrangement, the capacitance of those junction diodes that are used for coupling is always less than the capacitance of the junction diodes that are used for tuning the adjoining circuits.

In operation, control voltage applied to control line 40 that is connected to the divider determines the band of frequencies that is passed from input terminals 14—15 through the filter to output terminals 16—17. The frequency varies directly with the magnitude of the control voltage. For example, if the filter is to be tuned to a higher frequency, a higher voltage is applied from an automatic frequency control or from potentiometer 28 to control line 40. Obviously, a change in control voltage is applied proportionally to all of the variable-capacitance junction diodes. Regardless of the value of the control voltage, the absolute value of the voltage applied to those diodes which are used for coupling is always greater than the voltage that is applied to those diodes which are used for tuning. The range of frequencies over which the filter will operate may be predetermined by adjustment of the trimmer capacitors corresponding to trimmer capacitor 20.

Although this invention has been described with respect to a particular embodiment thereof, it is not to be so limited as changes and modifications may be made therein which are within the full intended scope of the invention as defined by the appended claim.

What is claimed is:

A filter having a plurality of tunable circuits, each tunable circuit including an inductor and a tuning variable-capacitance junction diode connected in parallel, a coupling variable-capacitance junction diode connected between each of said circuits for connecting the circuits in cascade, a tuning control circuit including a source of variable control voltage and pluralities of first and second resistors, said first resistors being alternately connected with said second resistors in a series circuit, the series circuit of said alternate first and second resistors being connected across said source, a bypass capacitor being connected to each junction in said series circuit, said first resistors being connected individually in a direct-current crcuit with said first variable-capacitance junction diodes for applying voltages in a reverse sense to the said tuning variable-capacitance junction diodes, adjoining first and second resistors of said series circuits being connected in individual pairs in a direct-current circuit for applying voltages in a reverse sense to said coupling variable-capacitance junction diodes, and said junction diodes responding to changes in control voltage for changing the frequency characteristics of said filter.

References Cited in the file of this patent

UNITED STATES PATENTS

| | | |
|---|---|---|
| 2,191,315 | Guanella | Feb. 20, 1940 |
| 2,243,921 | Rust | June 3, 1941 |

OTHER REFERENCES

Crystal Rectifiers (Torrey, Whitmer), pub. by McGraw-Hill, 1948, pages 24, 77, 163–177.